US012562701B2

(12) United States Patent
McGuire

(10) Patent No.: US 12,562,701 B2
(45) Date of Patent: Feb. 24, 2026

(54) MULTI-STAGE, FULLY-DIFFERENTIAL CLASS-AB AMPLIFIER

(71) Applicant: MICROCHIP TECHNOLOGY INCORPORATED, Chandler, AZ (US)

(72) Inventor: Matt McGuire, Tempe, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 459 days.

(21) Appl. No.: 18/202,679

(22) Filed: May 26, 2023

(65) Prior Publication Data

US 2024/0322773 A1 Sep. 26, 2024

Related U.S. Application Data

(60) Provisional application No. 63/454,178, filed on Mar. 23, 2023.

(51) Int. Cl.
H03F 3/45 (2006.01)

(52) U.S. Cl.
CPC ... H03F 3/45264 (2013.01); *H03F 2200/129* (2013.01)

(58) Field of Classification Search
CPC ........... H03F 3/45264; H03F 2200/129; H03F 3/45475; H03F 3/45659
USPC ............................................... 330/252–261
See application file for complete search history.

(56) References Cited

U.S. PATENT DOCUMENTS

2013/0278334 A1* 10/2013 Murugesan ........... H03F 3/3022
330/192

OTHER PUBLICATIONS

International Search Report and Written Opinion of the International Searching Authority, Feb. 29, 2024, PCT/US23/078677, European Patent Office.
Compact Low-Voltage Power-Efficient Operational Amplifier Cells for VLSI, Langen and Huijsing, IEEE Journal of Solid-State Circuits, vol. 33. No. 10, Oct. 1, 1998.
A Fully Differential Switched Capacitor Amplifier with a Two-Stage Folded-Mesh Class AB Operational Amplifier in a 22 NM FD-SOI CMOS Process, Koh Jeongwook et al., ISOCC 2022 19th International SOC Design Conference, (ISOCC), IEEE, Oct. 19, 2022.

(Continued)

*Primary Examiner* — Andrea Lindgren Baltzell
*Assistant Examiner* — Khiem D Nguyen
(74) *Attorney, Agent, or Firm* — Shumaker, Loop & Kendrick, LLP; Ryan M. Corbett

(57) ABSTRACT

A fully-differential amplifier is provided that includes one or more stages and a class-AB output stage. The one or more stages amplify a differential pair of input signals to produce an amplified differential pair of signals, and the class-AB output stage further amplifies the amplified differential pair of signals to produce a differential pair of output signals. The class-AB output stage includes a pair of differential outputs. For respective ones of the pair of differential outputs, the class-AB output stage includes a folded mesh of transistors and a feedback circuit. Transistors of the folded mesh of transistors form a control amplifier to regulate control inputs of the pair of output transistors, and the feedback circuit drives this control amplifier. The folded mesh of transistors biases a pair of output transistors in class-AB.

23 Claims, 7 Drawing Sheets

(56)            References Cited

OTHER PUBLICATIONS

Bulk-Driven Class AB Fully Balanced Differential Difference Amplifier, Khateb et al., Analog Integrated Circuits and Signal Processing, Springer New York LLC, Jul. 17, 2017.

Klaas-Jan de Langen et al., "Compact Low-Voltage Power-Efficient Operational Amplifier Cells for VLSI", IEEE Journal of Solid-State Circuits, vol. 33, No. 10, Oct. 1998, pp. 1482-1496.

International Preliminary Report on Patentability issued in corresponding International Application No. PCT/US2023/078677 issued Sep. 20, 2025 (9 Pages).

* cited by examiner

MULTI-STAGE, FULLY-DIFFERENTIAL CLASS-AB AMPLIFIER

CROSS-REFERENCE TO RELATED APPLICATION(S)

The present application claims priority to U.S. Provisional Patent Application No. 63/454,178, entitled: A Multi-Stage, Fully-Differential Class-AB Amplifier, filed on Mar. 23, 2023, the content of which is hereby incorporated by reference in its entirety.

TECHNOLOGICAL FIELD

The present disclosure relates generally to fully-differential amplifiers and, in particular, to multi-stage, fully-differential class-AB amplifiers.

BACKGROUND

Differential amplifiers are electronic amplifiers that take two input signals and amplify the difference between them while rejecting any common mode signal. They are used to amplify small signals in a wide range of applications, including analog front-end (AFE) systems that are responsible for amplifying, filtering, and converting analog signals into digital signals for further processing.

Differential amplifiers are often used in AFE systems to amplify small signals from sensors and other devices, such as microphones and thermocouples. They are also used in analog-to-digital converters (ADCs) and other data acquisition systems. Differential amplifiers are used in medical imaging systems, such as MRI and CT scanners, to amplify the signals from the sensors. They are also used in telecommunications systems to amplify the signals from antennas and other devices.

Differential amplifiers can be implemented in various ways, including with very large-scale integration (VLSI) circuits that are typically used in high-speed, high-performance applications. VLSI circuits are often composed of transistors and other electronic components that are connected on a single chip. This reduces the size and cost of the circuit, while increasing its speed and reliability.

Transistors used in VLSI circuits are typically created with a focus on digital circuits instead of analog, and threshold voltage selection for some device types may not be available. Due to this, designing amplifiers for operation from typical supply voltages down to half of typical supply is challenging given the devices available. Most conventional complementary metal-oxide semiconductor (CMOS) class-AB operational amplifier designs, for example, are operable at a minimum of two threshold voltages plus two drain-to-source voltage drops ($2V_{TH}+2V_{DSat}$) with a standard Monticelli-style bias circuit. The threshold voltages of many CMOS devices do not allow supply voltages below about 2 volts for Class-AB operational amplifier designs with the standard Monticelli-style bias circuit.

It would therefore be desirable to have a system and method that considers at least some of the issues discussed above, as well as other possible issues.

BRIEF SUMMARY

Example implementations of the present disclosure are directed to a fully-differential amplifier, and more particularly, a fully-differential class-AB amplifier. The fully-differential amplifier may be a multi-stage amplifier with one or more stages and a class-AB output stage. The class-AB output stage may be implemented in a fully-differential configuration and may be designed to operate at voltages down to one threshold voltage plus two drain-to-source voltage drops ($1V_{TH}+2V_{DSat}$). In this regard, the fully-differential amplifier may be used at a lower voltage (e.g., 0.4 to 0.9 volts lower) than what may be otherwise achieved by conventional process and typical class-AB designs.

The fully-differential amplifier may be useful in several applications, such as part of an AFE system to amplify signals from a sensor. In more specific examples, the fully-differential amplifier may be used as the front-end amplifier for a high-resolution ADC. In this regard, the fully-differential amplifier may provide high-bandwidth, low-power, high common-mode rejection, and low-voltage operation.

The present disclosure thus includes, without limitation, the following example implementations.

Some example implementations provide a fully-differential amplifier comprising: one or more stages to amplify a differential pair of input signals to produce an amplified differential pair of signals; and a class-AB output stage to further amplify the amplified differential pair of signals to produce a differential pair of output signals, the class-AB output stage including a pair of differential outputs, the class-AB output stage including for respective ones of the pair of differential outputs: a pair of output transistors coupled to a respective one of the pair of differential outputs, and to respective ones of a first supply rail and a second supply rail; a folded mesh of transistors to bias the pair of output transistors in class-AB, and in which transistors of the folded mesh of transistors form a control amplifier to regulate control inputs of the pair of output transistors; and a feedback circuit to drive the control amplifier.

Some example implementations provide a fully-differential amplifier comprising: one or more stages to amplify a differential pair of input signals to produce an amplified differential pair of signals, the one or more stages including a folded-cascode (FC) amplification stage that includes for respective ones of the differential pair of input signals: a first pair of current sources; a second pair of current sources; and an input pair of transistors, the first pair of current sources to provide tail currents for the input pair of transistors, the input pair of transistors to conduct currents from or to respective summing nodes of the second pair of current sources that provide currents to the FC stage.

Some example implementations provide a fully-differential amplifier comprising: one or more stages to amplify a differential pair of input signals to produce an amplified differential pair of signals, the one or more stages including an amplification stage with a common-mode feedback (CMFB) input for a CMFB control signal; and a CMFB control circuit to measure a midpoint of the differential pair of output signals and produce the CMFB control signal to drive the midpoint of the differential pair of output signals to a common-mode setpoint, the CMFB control circuit including a CMFB amplifier circuit that includes: a pair of diode connected devices; and a pair of input transistors to input respective ones of the common-mode setpoint and the midpoint of the differential pair of output signals, the pair of input transistors to conduct a current that flows through the pair of diode connected devices that produce the CMFB control signal.

These and other features, aspects, and advantages of the present disclosure will be apparent from a reading of the following detailed description together with the accompanying figures, which are briefly described below. The present disclosure includes any combination of two, three, four or more features or elements set forth in this disclosure, regardless of whether such features or elements are expressly combined or otherwise recited in a specific example implementation described herein. This disclosure is intended to be read holistically such that any separable features or elements of the disclosure, in any of its aspects and example implementations, should be viewed as combinable unless the context of the disclosure clearly dictates otherwise.

It will therefore be appreciated that this Brief Summary is provided merely for the purpose of summarizing some example implementations so as to provide a basic understanding of some aspects of the disclosure. Accordingly, it will be appreciated that the above-described example implementations are merely examples and should not be construed to narrow the scope or spirit of the disclosure in any way. Other example implementations, aspects and advantages will become apparent from the following detailed description taken in conjunction with the accompanying figures which illustrate, by way of example, the principles of some described example implementations.

BRIEF DESCRIPTION OF THE FIGURE(S)

Having thus described example implementations of the disclosure in general terms, reference will now be made to the accompanying figures, which are not necessarily drawn to scale, and wherein:

DETAILED DESCRIPTION

Figure 1:
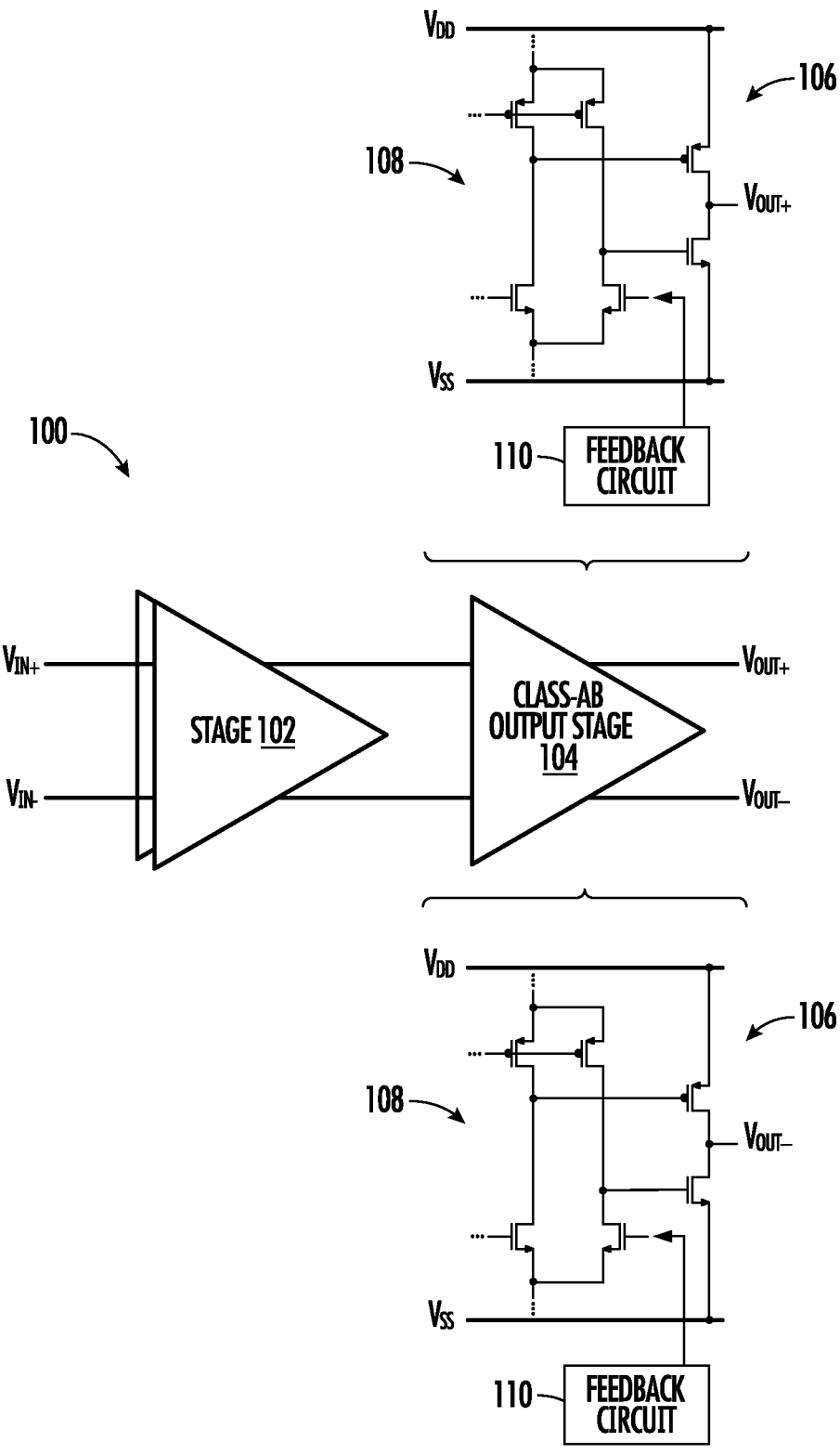
FIG. 1 is a block diagram of a fully-differential amplifier, according to some example implementations of the present disclosure.

Some implementations of the present disclosure will now be described more fully hereinafter with reference to the accompanying figures, in which some, but not all implementations of the disclosure are shown. Indeed, various implementations of the disclosure may be embodied in many different forms and should not be construed as limited to the implementations set forth herein; rather, these example implementations are provided so that this disclosure will be thorough and complete, and will fully convey the scope of the disclosure to those skilled in the art. Like reference numerals refer to like elements throughout.

Unless specified otherwise or clear from context, references to first, second or the like should not be construed to imply a particular order. A feature described as being above another feature (unless specified otherwise or clear from context) may instead be below, and vice versa; and similarly, features described as being to the left of another feature else may instead be to the right, and vice versa. Also, while reference may be made herein to quantitative measures, values, geometric relationships or the like, unless otherwise stated, any one or more if not all of these may be absolute or approximate to account for acceptable variations that may occur, such as those due to engineering tolerances or the like.

As used herein, unless specified otherwise or clear from context, the "or" of a set of operands is the "inclusive or" and thereby true if, and only if, one or more of the operands is true, as opposed to the "exclusive or" which is false when all of the operands are true. Thus, for example, "[A] or [B]" is true if [A] is true, or if [B] is true, or if both [A] and [B] are true. Further, the articles "a" and "an" mean "one or more," unless specified otherwise or clear from context to be directed to a singular form. Furthermore, it should be understood that unless otherwise specified, the terms "data," "content," "digital content," "information," and similar terms may be at times used interchangeably.

Example implementations of the present disclosure relate generally to fully-differential amplifiers and, in particular, to multi-stage, fully-differential class-AB amplifiers for low-voltage applications. As understood by those skilled in the art, different types of amplifiers may be classified in amplifier classes that indicate an amplifier's characteristics and performance. A class-A amplifier may be characterized by having an output stage which is always in conduction. A class-B amplifier may be characterized by having an output stage comprised of a pair of output devices each only conducting for half of the input cycle, or less. A class-AB amplifier combines features of class-A amplifiers and class-B amplifiers. In a class-AB amplifier both of the output devices may be in conduction together for some portion of the input cycle, such as when the input cycle is close to zero degrees.

FIG. 1 is a block diagram of a fully-differential amplifier 100, according to some example implementations of the present disclosure. A fully-differential amplifier is an electronic voltage amplifier with differential inputs and differential outputs. A fully-differential amplifier can amplify the difference between two input signals and provide both an amplified positive and an amplified negative output, both of which are referenced to a common-mode voltage.

As shown, the fully-differential amplifier 100 amplifies a differential pair of input signals $V_{IN+}$, $V_{IN-}$ to produce a differential pair of output signals $V_{OUT+}$, $V_{OUT-}$. As also shown, the fully-differential amplifier may be a multi-stage amplifier with multiple stages to amplify the differential pair of input signals. These stages may include one or more stages 102 to amplify the differential pair of input signals to produce an amplified differential pair of signals, and a class-AB output stage 104 to further amplify the amplified differential pair of signals to produce a differential pair of output signals $V_{OUT+}$, $V_{OUT-}$.

As also shown, the class-AB output stage 104 includes a pair of differential outputs to output the differential pair of output signals $V_{OUT+}$, $V_{OUT-}$, either of which may more generally be referenced as $V_{OUT+/-}$. The class-AB output stage includes for respective ones of the pair of differential outputs, a pair of output transistors 106, a folded mesh of transistors 108, and a feedback circuit 110. The pair of output transistors 106 are coupled to a respective one of the pair of differential outputs $V_{OUT+/-}$, and to respective ones of a first supply rail $V_{DD}$ and a second supply rail $V_{SS}$. The folded mesh of transistors 108 bias the pair of output transistors 106 in class-AB. Transistors of the folded mesh of transistors 108 form a control amplifier to regulate control inputs of the pair of output transistors 106, and the feedback circuit 110 drives the control amplifier.

Figure 2:
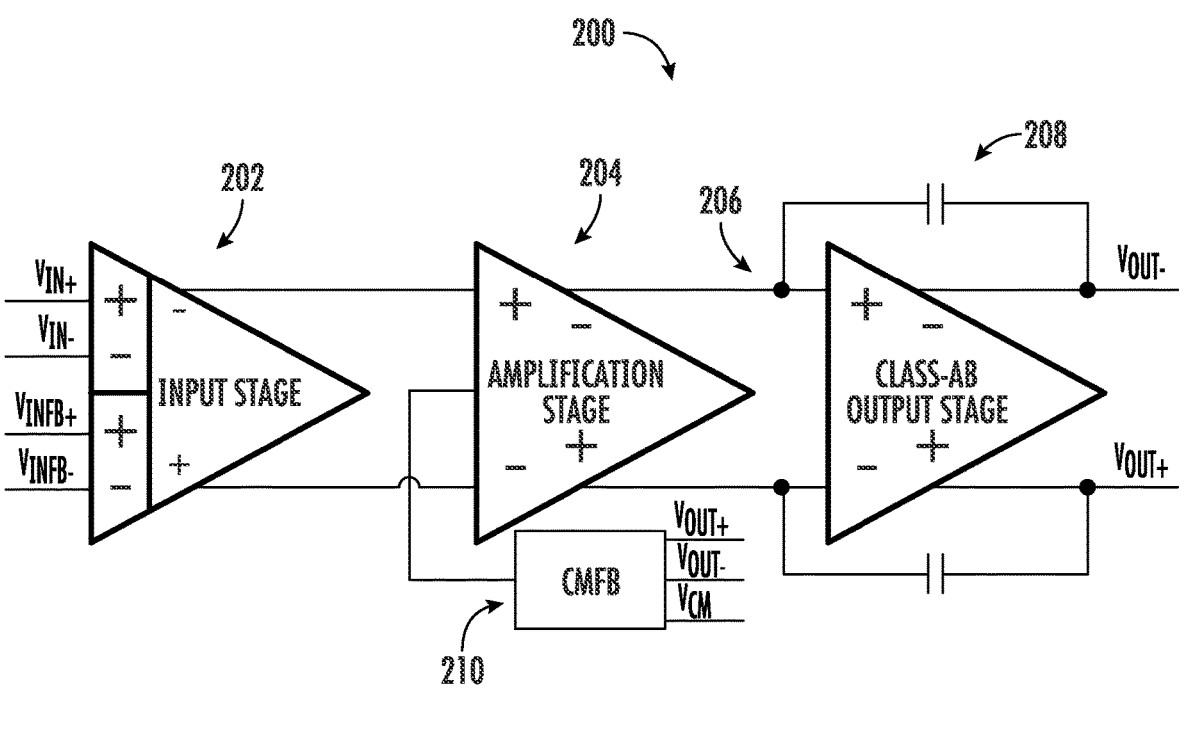
FIG. 2 is a block diagram of a fully-differential amplifier that may correspond to the fully-differential amplifier of FIG. 1, according to some more specific example implementations.

FIG. 2 is a block diagram of a fully-differential amplifier 200 that may correspond to the fully-differential amplifier 100 of FIG. 1, according to some more specific example implementations. As shown more particularly in FIG. 2, in some examples, the one or more stages include an input stage 202, and an amplification stage 204, without limitation. The fully-differential amplifier 200 is also shown with a class-AB output stage 206; and in some examples, the fully-differential amplifier 200 includes a compensation network 208, illustrated as a pair of capacitors, to provide frequency compensation for the fully-differential amplifier 200. And as also shown, the fully-differential amplifier may include a common-mode feedback (CMFB) control circuit 210.

In some more particular examples, the input stage 202 may be implemented as a fully-balanced differential difference amplifier (FBDDA) stage, and the amplification stage 204 may be implemented as a single-stage fully-differential amplifier. A differential difference amplifier (DDA) is an operational amplifier with four inputs for two differential pairs of signals, such as the differential pair of input signals $V_{IN+}$, $V_{IN-}$ and a differential pair of feedback signals $V_{INFB+}$, $V_{INFB-}$ from a feedback network. The DDA compares the two differential pairs of signals and amplifies the difference between the two differential pairs of signals, $(V_{IN+}-V_{IN-})-(V_{INFB+}-V_{INFB-})$. The FBDDA is a version of the DDA that provides both an amplified positive and an amplified negative output. It should be understood, however, that the fully-differential amplifier 200 may include one or more additional or alternate stages, fewer stages than shown, and may include appropriate supporting circuitry. Other examples of suitable stages include followers, mirrors, buffers and other voltage or current amplification stages.

Figure 3:
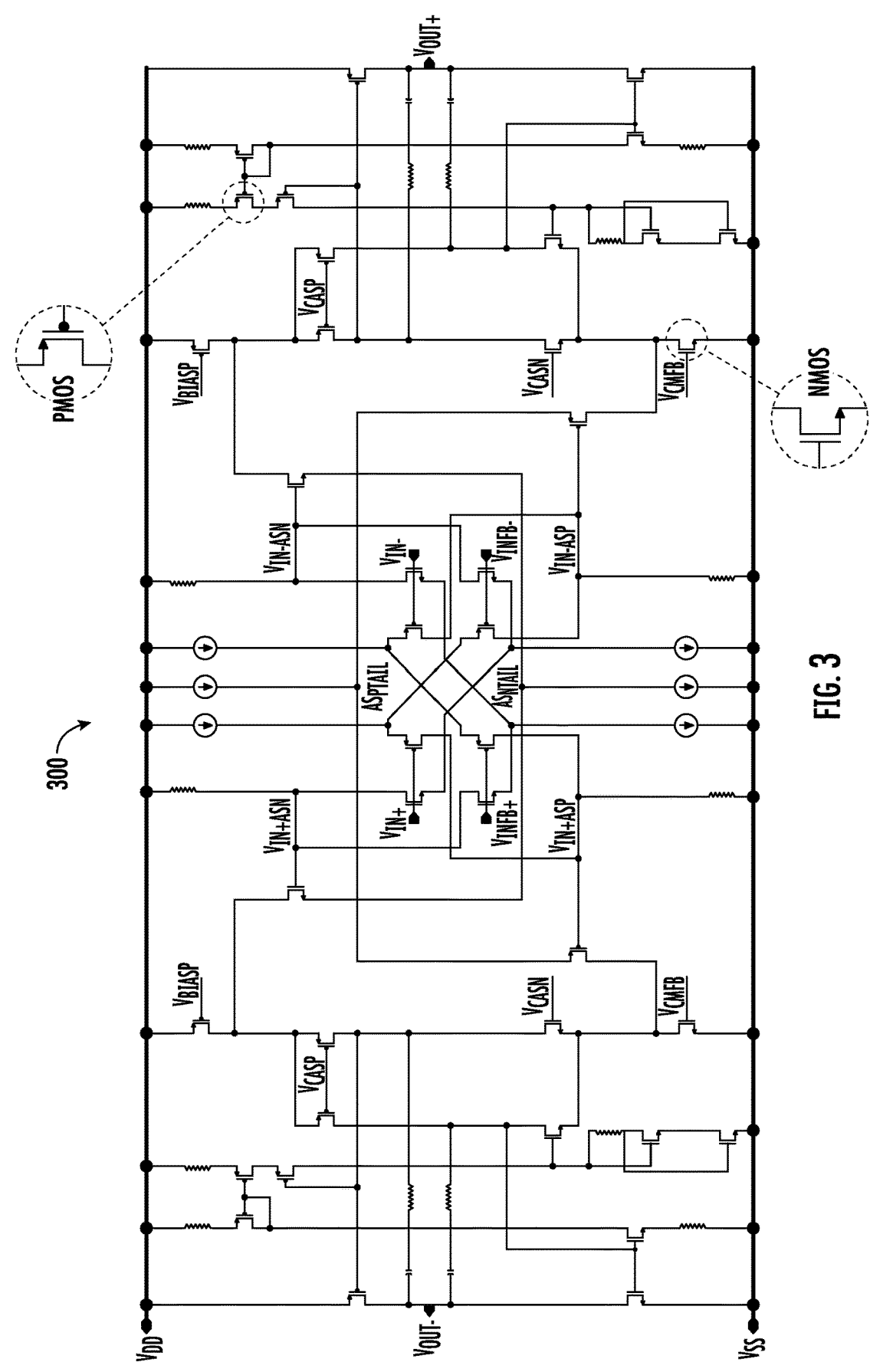
FIG. 3 is a circuit diagram of a fully-differential amplifier with multiple stages that may correspond to those of the fully-differential amplifier of FIG. 2, according to some example implementations.

FIG. 3 is a circuit diagram of a fully-differential amplifier 300 with multiple stages that may correspond to those of the fully-differential amplifier 200 of FIG. 2, according to some example implementations. The fully-differential amplifier 300 may be implemented with a number of transistors and other electronic components such as resistors and capacitors, arranged in a complementary or differential configuration. In some examples, the transistors are metal-oxide-semiconductor field-effect transistors (MOSFETs) and include a combination of n-channel MOSFETs (NMOS) transistors and p-channel MOSFETs (PMOS) transistors. In this regard, the fully-differential amplifier 300 includes NMOS and PMOS sides. It should be understood, however, that the NMOS and PMOS sides may be reversed with only slight modifications in connections between the transistors.

Figure 4:
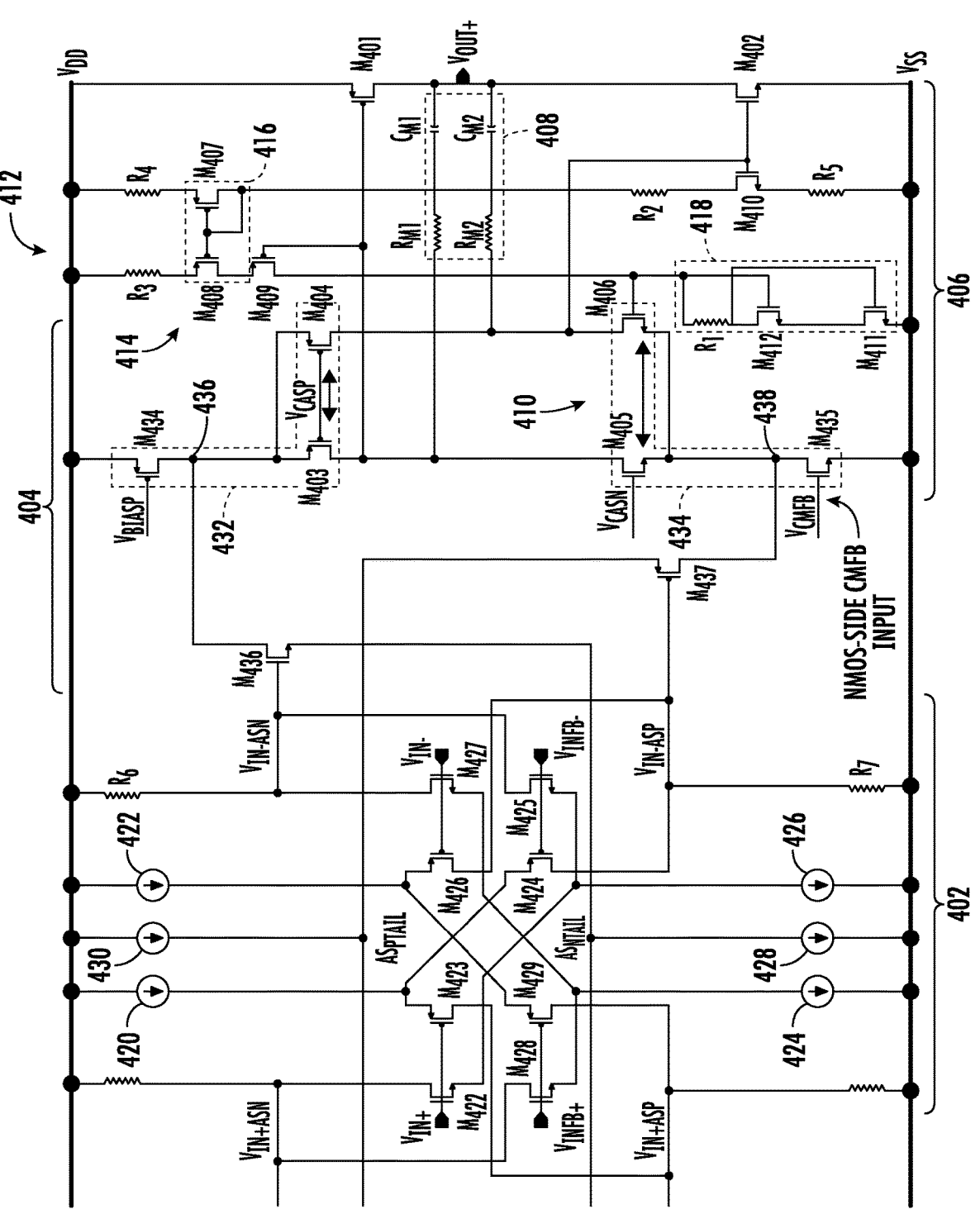
FIG. 4 is a circuit diagram of one end of the fully-differential amplifier of FIG. 2, according to some example implementations.

In some examples, the fully-differential amplifier 300 is symmetrical, and includes an arrangement of transistors and resistors to amplify respective ones of the differential pair of input signals $V_{IN+}$, $V_{IN-}$ to produce respective ones of the differential pair of output signals $V_{OUT+}$, $V_{OUT-}$. To further illustrate and describe the fully-differential amplifier 300, FIG. 4 is a circuit diagram of one end of the fully-differential amplifier 300 for the positive output signal $V_{OUT+}$. The following description applies equally to the other end of the fully-differential amplifier for the negative output signal $V_{OUT-}$.

Again, as shown, the fully-differential amplifier 300 has multiple stages including a FBDDA stage 402, a folded-cascode (FC) amplification stage 404, and a class-AB output stage 406, which may correspond to respective ones of the input stage 202, amplification stage 204, and class-AB output stage 206 of the fully-differential amplifier 200 of FIG. 2. Beginning at the output, the class-AB output stage 406 includes a number of components for respective ones of a pair of differential outputs to output the differential pair of output signals where only $V_{OUT+}$ is shown. These components include a pair of output transistors (with a first output transistor $M_{401}$ and a second output transistor $M_{402}$) coupled to a respective one of the pair of differential outputs $V_{OUT+/-}$, particularly $V_{OUT+}$, and to respective ones of a first supply rail $V_{DD}$ and a second supply rail $V_{SS}$.

The fully-differential amplifier 300 may include a compensation network 408 for the respective one of the pair of differential outputs $V_{OUT+/-}$, which may correspond to compensation network 208. In this regard, the compensation network may provide frequency compensation for the fully-differential amplifier 300. As shown, the compensation network 408 comprises $R_{M1}$, $C_{M1}$ and $R_{M2}$, $C_{M2}$ that are connected to the pair of output transistors and the respective one of the pair of differential outputs $V_{OUT+/-}$, and the compensation network provides frequency compensation for the fully-differential amplifier 300 using Miller compensation. More generally, the compensation network may frequency compensate the fully-differential amplifier 300 using compensation capacitance, resistance, current feedback, or any combination of circuits that operate to provide frequency compensation.

The class-AB output stage 406 includes a folded mesh of transistors $M_{403}$, $M_{404}$, $M_{405}$, $M_{406}$ to bias the pair of output transistors $M_{401}$, $M_{402}$ in class-AB. In the folded mesh, transistors $M_{403}$, $M_{404}$ are cascode devices with their gates and sources in parallel, and their drains independent from one another. Also in the folded mesh, transistors $M_{405}$, $M_{406}$ form a control amplifier 410 to regulate control inputs of the pair of output transistors $M_{401}$, $M_{402}$. The class-AB output stage includes a feedback circuit 412 to drive the control amplifier 410 formed of transistors $M_{405}$, $M_{406}$.

The feedback loop containing the feedback circuit 412, folded mesh of transistors $M_{403}$, $M_{404}$, $M_{405}$, $M_{406}$, including the control amplifier 410, and the output transistors $M_{401}$, $M_{402}$ regulates the quiescent current through the class-AB output stage 406. In various example implementations, described in greater detail below, the feedback circuit 412 uses a minimum selector circuit and the control amplifier 410 to control the quiescent current through the class-AB output stage 406, which allows a lower voltage operation than other class-AB output stages such as those that use a Monticelli bias system.

In some more particular examples, the feedback circuit 412 includes a minimum selector circuit 414 (e.g., minimum current selector circuit) including a current mirror 416 comprising transistors $M_{407}$, $M_{408}$, and a first sense transistor $M_{409}$. The feedback circuit 412 also includes a second sense transistor $M_{410}$ and a rectifier 418 coupled to the first sense transistor $M_{409}$. The second sense transistor $M_{410}$ senses current through the second output transistor $M_{402}$ and conducts a current that is proportional to the current of second output transistor $M_{402}$. This current is mirrored through the current mirror 416 to the first sense transistor $M_{409}$ that senses the current through the first output transistor $M_{401}$.

The first sense transistor $M_{409}$ conducts a current that is proportional to the lesser of the currents of the first and second output transistors $M_{401}$, $M_{402}$. The current of first sense transistor $M_{409}$ flows through the rectifier 418 and steers the control amplifier 410 formed by transistors $M_{405}$, $M_{406}$. As the first sense transistor $M_{409}$ conducts less current, the gate voltage on transistor $M_{406}$ decreases, the gate voltage at the second output transistor $M_{402}$ increases, and the gate voltage at the first output transistor $M_{401}$ decreases, to allow the output transistors $M_{401}$, $M_{402}$ to conduct more quiescent current. As the first sense transistor $M_{409}$ conducts more current, the gate voltage on transistor $M_{406}$ increases, the gate voltage at the second output transistor $M_{402}$ decreases, and the gate voltage at the first output transistor $M_{401}$ increases, to reduce the quiescent current of the output transistors $M_{401}$, $M_{402}$. The steady-state quiescent current is proportional to the feedback current ratio and thereby the voltage developed on the rectifier 418.

In some examples (not shown), the rectifier 418 is implemented with a diode-connected transistor $M_{411}$. In other examples, the rectifier 418 is implemented with a cascode diode-connected transistor, represented in the figure by resistor $R_1$ and transistors $M_{411}$, $M_{412}$. This cascode diode-connected transistor may be used to match the cascode voltage of a main bias generator circuit (not shown). The main bias generator circuit generates bias voltages for current sources and cascoded devices; and in one example, the main bias generation circuit for the NMOS side of the fully-differential amplifier 300 may be similar to the cascode diode-connected transistor formed by $R_1$, $M_{411}$, $M_{412}$. The resistor in the main bias generation circuit provides a voltage drop that creates a cascode bias voltage relative to the main bias voltage. To balance the differential pair created by $M_{405}$ and $M_{406}$, transistor $M_{406}$ expects a quiescent voltage level near the NMOS cascode voltage presented on $M_{405}$. Due to this, the rectifier 418 may be similar in construction to the main bias voltage generator circuit that provides the voltage to $M_{405}$.

In some examples, the feedback circuit 412 of the class-AB output stage 406 includes a resistor $R_2$ coupled between the second sense transistor $M_{410}$ and the current mirror $M_{407}$, $M_{408}$. Resistor $R_2$ prevents the current mirror $M_{407}$, $M_{408}$ from conducting excessive current in the event the second output transistor $M_{402}$ is in full or nearly full conduction.

In some examples, the feedback circuit 412 of the class-AB output stage 406 includes one or more source degeneration resistors $R_3$, $R_4$, $R_5$ to control a transconductance of the feedback circuit 412. The one or more source degeneration resistors $R_3$, $R_4$, $R_5$ may include first and second source degeneration resistors $R_3$, $R_4$ respectively coupled between the transistors of current mirror $M_{407}$, $M_{408}$ and the first supply rail $V_{DD}$, and a third source degeneration resistor $R_5$ coupled between the second sense transistor $M_{410}$ and the second supply rail $V_{SS}$.

Preceding the class-AB output stage 406, the fully-differential amplifier 300 has one or more stages including a FBDDA stage 402 and a FC amplification stage 404. In some examples, the fully-differential amplifier 300 is connected as a current-feedback amplifier, and the FBDDA stage 402 includes multiple pairs of inputs. In this regard, the FBDDA stage 402 includes a first pair of inputs to receive one of the differential pair of input signals and an opposite one of a differential pair of input feedback signals, e.g., $V_{IN+}$, $V_{INFB-}$, and a second pair of inputs to receive the other one of the differential pair of input signals and the other, opposite one of the differential pair of input feedback signals, e.g., $V_{IN-}$, $V_{INFB+}$.

The FBDDA stage 402 includes a first pair of current sources 420, 422 to provide tail currents for the first pair of inputs, and a second pair of current sources 424, 426 to provide tail currents for the second pair of inputs. In some examples, the current sources 420, 422, 424, 426 may be implemented as a source and cascode transistor pair, although a single transistor may be used for the respective current sources in other examples. For respective ones of the pair of differential outputs, the FBDDA stage 402 includes output nodes for output signals $V_{IN-ASN}$, $V_{IN-ASP}$. ("ASN" and "ASP" referring to amplification stage, NMOS side and PMOS side, respectively) and respective ones of their symmetric pairs $V_{IN-ASN}$ and $V_{IN+ASP}$. Also, for each output, the FBDDA 402 includes load resistors $R_6$, $R_7$ coupled to the output nodes and respective ones of the first supply rail $V_{DD}$ and the second supply rail $V_{SS}$. Load resistors $R_6$, $R_7$ may be chosen to present a DC bias level to the next stage (e.g., the FC amplification stage 404) that allows desired performance. As described above, $V_{IN-ASN}$, $V_{IN-ASP}$ and $V_{IN+ASN}$, $V_{IN+ASP}$ refer to the negative-side and positive-side voltage inputs of the next stage for respective devices of the NMOS side and PMOS side. Other signals indicated include for the NMOS side and PMOS side, a shared amplification stage current source tail ($AS_{NTAIL}$, $AS_{PTAIL}$), main current source bias ($V_{BIASP}$ shown only for the PMOS side), and current source cascode bias ($V_{CASN}$, $V_{CASP}$).

Figure 5:
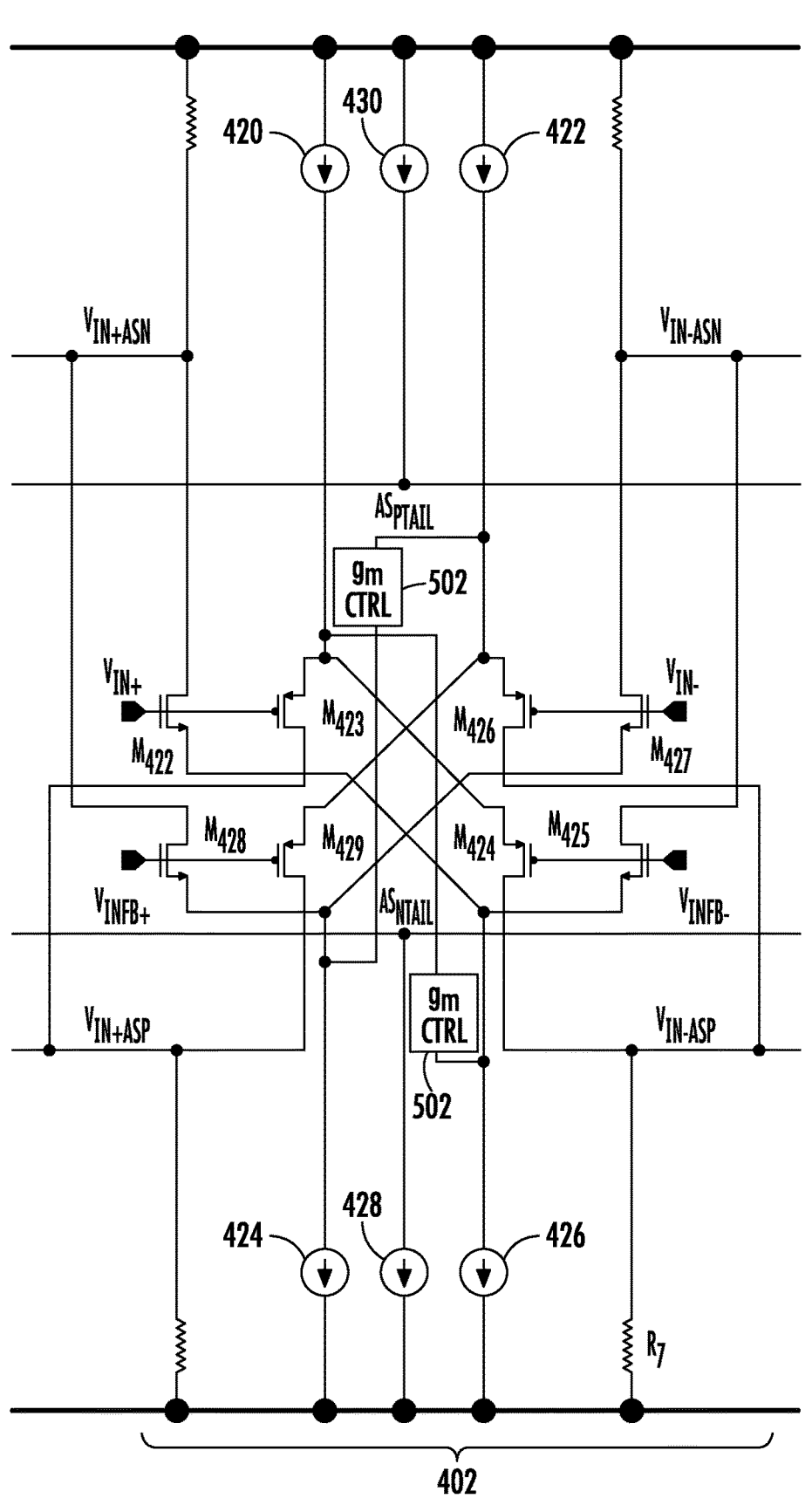
FIG. 5 is a portion of the circuit diagram of FIG. 4 in which one of the multiple stages includes a set of transconductance control circuits, according to some example implementations.

As shown in FIG. 5, in some examples, the FBDDA stage 402 includes a set of transconductance control circuits ($g_m$ CTRL) 502. In some examples, the set of transconductance control circuits 502 may act as an electronic implementation of a Zener diode in that the set of transconductance control circuits allow conductance of the tail current to equalize transconductance of the input devices. In another example, the set of transconductance control circuits may act as current switches for the first pair of inputs or the second pair of inputs. In particular, for example, the set of transconductance control circuits may allow conductance of the tail current to equalize transconductance of transistors ($M_{422}$, $M_{423}$), ($M_{424}$, $M_{425}$) of the first pair of inputs and transistors ($M_{426}$, $M_{427}$), ($M_{428}$, $M_{429}$) of the second pair of inputs.

Returning to FIG. 4, the fully-differential amplifier 300 in the illustrated implementation includes the FC amplification stage 404 between the FBDDA stage 402 and the class-AB output stage 406. Similar to the other stages, the FC amplification stage 404 includes a number of components for respective ones of the differential pair of input signals $V_{IN+}$, $V_{IN-}$. The FC amplification stage 404 includes a first pair of current sources 428, 430, and a second pair of current sources 432, 434 comprising transistors ($M_{434}$, $M_{403}$, $M_{404}$), ($M_{435}$, $M_{405}$, $M_{406}$), respectively. In some examples, the current sources 428, 430 may be implemented as a source and cascode transistor pair, although a single transistor may be used for the respective current sources in other examples. The FC amplification stage 404 also includes an input pair of transistors $M_{436}$, $M_{437}$. The first pair of current sources 428, 430 provide respective tail currents for the input pair of transistors $M_{436}$, $M_{437}$. The input pair of transistors $M_{436}$, $M_{437}$ conduct currents from or to respective summing nodes 436, 438 of the second pair of current sources 432, 434 that provide currents to the FC amplification stage 404. In some examples, as shown, the currents provided by the second pair of current sources 432, 434 may be in a cascode configuration.

In the illustrated implementation, the second pair of current sources 432, 434 are implemented with transistors including the transistors $M_{403}$, $M_{404}$, $M_{405}$, $M_{406}$ of the folded mesh of transistors. The double-sided arrows between $M_{403}$ and $M_{404}$, and between $M_{405}$ and $M_{406}$, indicate devices which have been split to create the folded mesh of transistors. The transistors $M_{403}$ and $M_{404}$ may still act as cascode devices; but as indicated above, the transistors $M_{405}$, $M_{406}$ have become a control amplifier 410 (differential amplifier) to control the class-AB quiescent current while also remaining as cascode devices for the FC amplification path.

Figure 6:
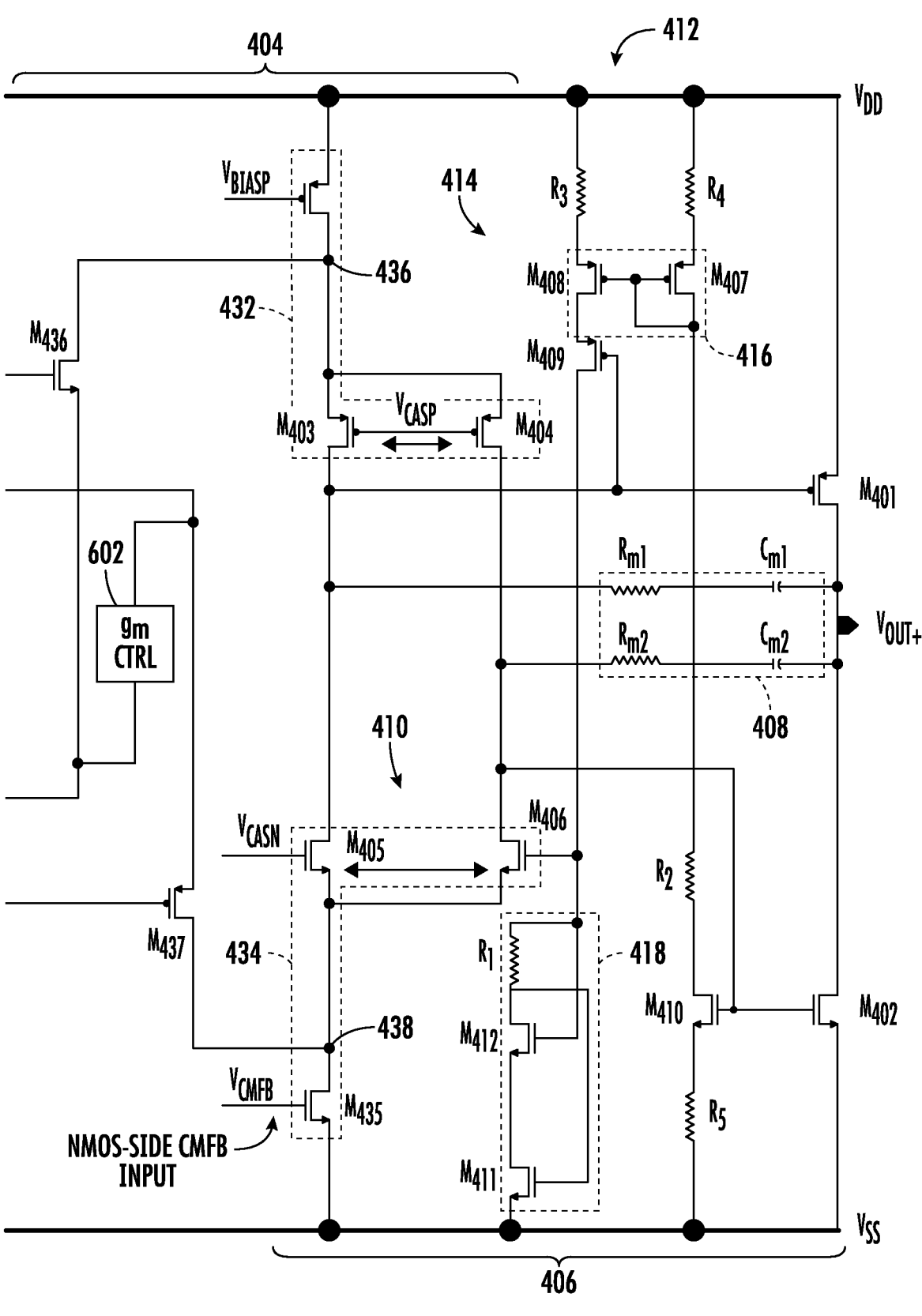
FIG. 6 is another portion of the circuit diagram of FIG. 4 in which another of the multiple stages includes a set of transconductance control circuits, according to some example implementations.

Similar to the FBDDA stage 402, in some examples, the FC amplification stage 404 includes a transconductance control circuit to act as an electronic implementation of a Zener diode or as current switches for the input pair of transistors $M_{436}$, $M_{437}$, as inputs to the FC amplification stage. FIG. 6 illustrates a transconductance control circuit ($g_m$ CTRL) 602 for one end of the fully-differential amplifier 300.

Returning to FIG. 4, as also shown, one of the current sources of either the first pair of current sources 428, 430 or the second pair of current sources 432, 434 of the FC amplification stage 404 includes a common-mode feedback (CMFB) input for a CMFB control signal $V_{CMFB}$. In the illustrated implementation, the CMFB input is coupled to the control input of transistor $M_{435}$, on the NMOS side of the fully-differential amplifier 300. As indicated above, however, in other implementations, the CMFB input may be coupled to the PMOS side of the fully-differential amplifier. In some of these implementations, the CMFB input may be coupled to the control input of transistor $M_{434}$, on the PMOS side of the fully-differential amplifier if the circuit is reconfigured as such. This reconfiguration of the CMFB input may also include reconnections of various ones of the other transistors, as will be appreciated by those skilled in the art. In other examples, the tail current sources 428 or 430 of the FC amplification stage 404 may include the CMFB input for the CMFB control signal $V_{CMFB}$. In yet other examples, the first pair of current sources 420, 422 or the second pair of current sources 424, 426 of the FBDDA stage 402 may include the CMFB input for the CMFB control signal $V_{CMFB}$.

Figure 7:
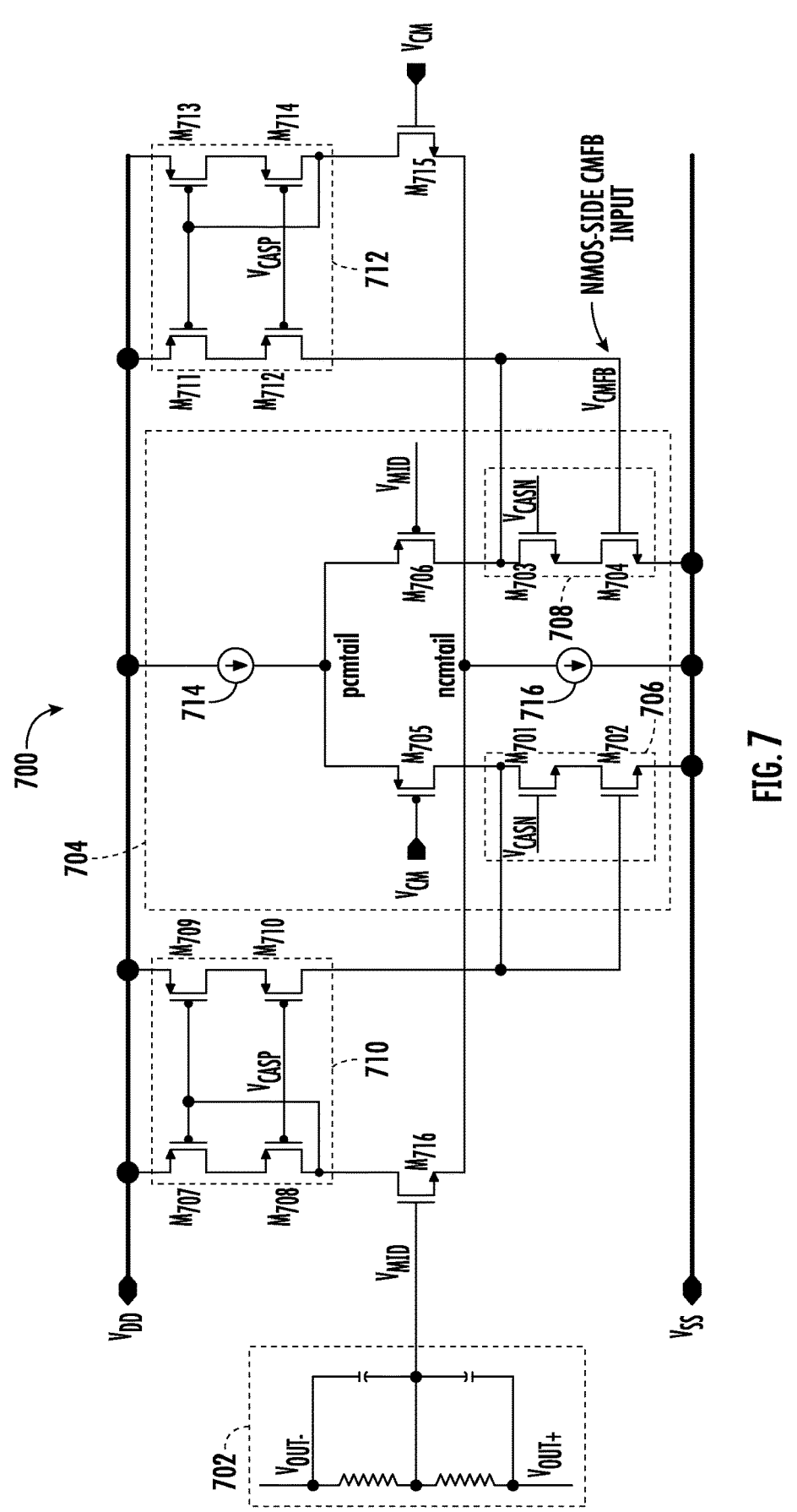
FIG. 7 is a circuit diagram of a common-mode feedback (CMFB) control circuit for a fully-differential amplifier, according to some example implementations.

FIG. 7 is a circuit diagram of a CMFB control circuit 700 that may correspond to CMFB control circuit 210 of the fully-differential amplifier 200 of FIG. 2, and which may provide the CMFB control signal $V_{CMFB}$ to the CMFB input of the FC amplification stage 404 of the fully-differential amplifier 300 of FIGS. 2 and 3. In some examples, as shown, the CMFB control circuit 700 is a rail-to-rail, symmetrical current mirror that provides low gain and high bandwidth for stability, without added compensation components. In some other examples, the CMFB circuit may provide the CMFB control signal to other stages of the amplifier if necessary. The rail-to-rail CMFB circuit 700 allows low-voltage operation to complement the low-voltage capability of the fully-differential amplifier 300.

As with the fully-differential amplifier 300, the CMFB control circuit 700 may include NMOS and PMOS sides; and as shown, the CMFB control circuit 700 provides a CMFB output signal, i.e., CMFB control signal $V_{CMFB}$ to the NMOS side of the fully-differential amplifier (as a CMFB input to the FC amplification stage). Again, however, it should be understood that the NMOS and PMOS sides may be reversed with only slight modifications in connections between the transistors. In this case, the CMFB control circuit 700 may alternately provide the CMFB output signal as a CMFB control signal $V_{CMFB}$ to the PMOS side of the fully-differential amplifier.

The CMFB control circuit 700 generally measures a midpoint $V_{MID}$ of the differential pair of output signals $V_{OUT+}$, $V_{OUT-}$, and produces a CMFB control signal $V_{CMFB}$ to drive the midpoint of the differential pair of output signals to a common-mode setpoint $V_{CM}$ (also shown in FIG. 2). In various examples, the common-mode setpoint $V_{CM}$ may be set by the user, such as one-half first supply rail $V_{DD}$. The CMFB control circuit 700 may be an amplifier that drives its output ($V_{CMFB}$) to act to equalize $V_{MID}$ and $V_{CM}$. In some examples, the CMFB control signal $V_{CMFB}$ may be biased to one gate-source voltage ($V_{GS}$) above the second supply rail $V_{SS}$ and vary as required to act to equalize $V_{MID}$ and $V_{CM}$.

As shown, in some examples, the CMFB control circuit 700 may include a resistive divider circuit 702 and a CMFB amplifier circuit 704. The resistive divider circuit of two equal resistors, which may include capacitors for added stability, produces a signal at the midpoint of the differential pair of output signals $V_{OUT+}$, $V_{OUT-}$. The CMFB amplifier circuit includes a pair of diode connected devices 706, 708 comprising cascode diode-connected transistors ($M_{701}$, $M_{702}$), ($M_{703}$, $M_{704}$), respectively. The CMFB circuit also includes a pair of input transistors $M_{705}$, $M_{706}$. The pair of input transistors $M_{705}$, $M_{706}$ input respective ones of the common-mode setpoint $V_{CM}$ and the midpoint $V_{MID}$ of the differential pair of output signals and conduct a current that flows through the pair of diode connected devices 706, 708. The diode connected device 708 produces the CMFB control signal $V_{CMFB}$ which steers the fully-differential amplifier 300 to drive $V_{MID}$ to $V_{CM}$. The other diode connected device 706 acts to maintain load symmetry in the differential amplifier.

In some examples, the CMFB control circuit 700 includes a pair of current mirrors 710, 712 comprising transistors ($M_{707}$, $M_{708}$, $M_{709}$, $M_{710}$), ($M_{711}$, $M_{712}$, $M_{713}$, $M_{714}$), respectively. The CMFB control circuit also includes a second pair of input transistors $M_{715}$, $M_{716}$. In some examples, as shown, the pair of current mirrors 710, 712 are a pair of cascoded current mirrors. In other examples, the pair of current mirrors may not be cascoded. The second pair of input transistors $M_{715}$, $M_{716}$ input respective ones of the common-mode setpoint $V_{CM}$ and the midpoint $V_{MID}$ of the differential pair of output signals, and conduct currents that flow through the pair of current mirrors 710, 712 of the CMFB control circuit 700. The pair of current mirrors 710, 712, then, conduct currents through the pair of diode connected devices 706, 708 to generate the output common-mode feedback voltage $V_{CMFB}$.

As also shown, for example, the CMFB control circuit includes current sources 714, 716. In some examples, the current sources 714, 716 may be implemented as a source and cascode transistor pair, although a single transistor may be used for the respective current sources in other examples. These current sources provide tail currents to respective ones of the pair of input transistors $M_{705}$, $M_{706}$, and the second pair of input transistors $M_{715}$, $M_{716}$, and are biased from the same bias and cascode voltage rails as the fully-differential amplifier 300.

As explained above and reiterated below, the present disclosure includes, without limitation, the following example implementations.

Clause 1. A fully-differential amplifier comprising: one or more stages to amplify a differential pair of input signals to produce an amplified differential pair of signals; and a class-AB output stage to further amplify the amplified differential pair of signals to produce a differential pair of output signals, the class-AB output stage including a pair of differential outputs, the class-AB output stage including for respective ones of the pair of differential outputs: a pair of output transistors coupled to a respective one of the pair of differential outputs, and to respective ones of a first supply rail and a second supply rail; a folded mesh of transistors to bias the pair of output transistors in class-AB, and in which transistors of the folded mesh of transistors form a control amplifier to regulate control inputs of the pair of output transistors; and a feedback circuit to drive the control amplifier.

Clause 2. The fully-differential amplifier of clause 1, wherein the fully-differential amplifier comprises, for respective ones of the pair of differential outputs: a compensation network to provide frequency compensation for the fully-differential amplifier.

Clause 3. The fully-differential amplifier of clause 1 or clause 2, wherein the pair of output transistors includes a first output transistor and a second output transistor, and the feedback circuit includes: a minimum selector circuit including a current mirror and a first sense transistor; a second sense transistor to sense current through the second output transistor, the second sense transistor to conduct a current that flows through the current mirror of the minimum selector circuit to the first sense transistor, the first sense transistor to sense the current through the first output transistor; and a rectifier coupled to the first sense transistor, the first sense transistor to conduct a current that flows through the rectifier and steers the control amplifier.

Clause 4. The fully-differential amplifier of clause 3, wherein the rectifier is implemented with a diode-connected transistor.

Clause 5. The fully-differential amplifier of clause 3 or clause 4, wherein the rectifier is implemented with a cascode diode-connected transistor.

Clause 6. The fully-differential amplifier of any of clauses 3 to 5, wherein the feedback circuit includes a resistor coupled between the second sense transistor and the current mirror to prevent the current mirror from conducting excessive current in the event the second output transistor is in or near full conduction.

Clause 7. The fully-differential amplifier of any of clauses 3 to 6, wherein the feedback circuit includes one or more source degeneration resistors to control a transconductance of the feedback circuit.

Clause 8. The fully-differential amplifier of clause 7, wherein the source degeneration resistors include first and second source degeneration resistors coupled between the current mirror and the first supply rail, and a third source degeneration resistor coupled between the second sense transistor and the second supply rail.

Clause 9. The fully-differential amplifier of any of clauses 1 to 8, wherein the one or more stages include a fully-balanced differential difference amplifier (FBDDA) stage.

Clause 10. The fully-differential amplifier of clause 9, wherein the fully-differential amplifier is connected as a current-feedback amplifier, and the FBDDA stage includes multiple pairs of inputs, including a first pair of inputs to receive one of the differential pair of input signals and an opposite one of a differential pair of input feedback signals, and a second pair of inputs to receive the other one of the differential pair of input signals and the other, opposite one, of the differential pair of input feedback signals.

Clause 11. The fully-differential amplifier of clause 10, wherein the FBDDA stage includes a first pair of current sources to provide tail currents for the first pair of inputs, and a second pair of current sources to provide tail currents for the second pair of inputs.

Clause 12. The fully-differential amplifier of clause 10 or clause 11, wherein for respective ones of the pair of differential outputs, the FBDDA stage includes: output nodes; and load resistors coupled to the output nodes and respective ones of the first supply rail and the second supply rail.

Clause 13. The fully-differential amplifier of any of clauses 9 to 12, wherein the FBDDA stage includes a set of transconductance control circuits to act as an electronic implementation of a Zener diode or as current switches for the first pair of inputs or the second pair of inputs.

Clause 14. The fully-differential amplifier of any of clauses 1 to 13, wherein the one or more stages include a folded-cascode (FC) amplification stage.

Clause 15. The fully-differential amplifier of clause 14, wherein the FC amplification stage includes for respective ones of the differential pair of input signals: a first pair of current sources; a second pair of current sources; and an input pair of transistors, the first pair of current sources to provide tail currents for the input pair of transistors, the input pair of transistors to conduct currents from or to respective summing nodes of the second pair of current sources that provide currents to the FC amplification stage.

Clause 16. The fully-differential amplifier of clause 15, wherein the second pair of current sources are implemented with transistors including the transistors of the folded mesh of transistors.

Clause 17. The fully-differential amplifier of clause 15 or clause 16, wherein one of the current sources of either the first pair of current sources or the second pair of current sources includes a common-mode feedback (CMFB) input for a CMFB control signal.

Clause 18. The fully-differential amplifier of any of clauses 15 to 17, wherein the FC amplification stage includes a set of transconductance control circuits to act as an electronic implementation of a Zener diode or as current switches for the input pair of transistors.

Clause 19. The fully-differential amplifier of any of clauses 1 to 18, wherein one of the one or more stages includes an amplification stage with a common-mode feedback input for a common-mode feedback (CMFB) control signal, and the fully-differential amplifier comprises: a CMFB control circuit to measure a midpoint of the differential pair of output signals and produce the CMFB control signal to drive the midpoint of the differential pair of output signals to a common-mode setpoint.

Clause 20. The fully-differential amplifier of clause 19, wherein the CMFB control circuit includes a resistive divider circuit to produce a signal at the midpoint of the differential pair of output signals.

Clause 21. The fully-differential amplifier of clause 19 or clause 20, wherein the CMFB control circuit includes a CMFB amplifier circuit including: a pair of diode connected devices; and a pair of input transistors to input respective ones of the common-mode setpoint and the midpoint of the differential pair of output signals, the pair of input transistors to conduct a current that flows through the pair of diode connected devices that produce the CMFB control signal.

Clause 22. The fully-differential amplifier of clause 21, wherein the CMFB control circuit includes: a pair of current mirrors; and a second pair of input transistors to input respective ones of the common-mode setpoint and the midpoint of the differential pair of output signals, the second pair of input transistors to conduct currents that flow through the pair of current mirrors of the CMFB control circuit that conduct currents through the pair of diode connected devices.

Clause 23. The fully-differential amplifier of clause 22, wherein the CMFB control circuit includes current sources to provide tail currents to respective ones of the pair of input transistors and the second pair of input transistors.

Clause 24. A fully-differential amplifier comprising: one or more stages to amplify a differential pair of input signals to produce an amplified differential pair of signals, the one or more stages including a folded-cascode (FC) amplification stage that includes for respective ones of the differential pair of input signals: a first pair of current sources; a second pair of current sources; and an input pair of transistors, the first pair of current sources to provide tail currents for the input pair of transistors, the input pair of transistors to conduct currents from or to respective summing nodes of the second pair of current sources that provide currents to the FC amplification stage.

Clause 25. The fully-differential amplifier of clause 24, wherein the fully-differential amplifier comprises a class-AB output stage to further amplify the amplified differential pair of signals to produce a differential pair of output signals, and the class-AB output stage includes a folded mesh of transistors to bias a pair of output transistors in class-AB, and wherein the second pair of current sources are implemented with transistors including the transistors of the folded mesh of transistors.

Clause 26. The fully-differential amplifier of clause 24 or clause 25, wherein one of the current sources of either the first pair of current sources or the second pair of current sources includes a common-mode feedback (CMFB) input for a CMFB control signal.

Clause 27. The fully-differential amplifier of clause 26, wherein the fully-differential amplifier comprises: a CMFB control circuit to measure a midpoint of the differential pair of output signals and produce the CMFB control signal to drive the midpoint of the differential pair of output signals to a common-mode setpoint.

Clause 28. The fully-differential amplifier of clause 27, wherein the CMFB control circuit includes a resistive divider circuit to produce a signal at the midpoint of the differential pair of output signals.

Clause 29. The fully-differential amplifier of clause 27 or clause 28, wherein the CMFB control circuit includes a CMFB amplifier circuit including: a pair of diode connected devices; and a pair of input transistors to input respective ones of the common-mode setpoint and the midpoint of the differential pair of output signals, the pair of input transistors to conduct a current that flows through the pair of diode connected devices that produce the CMFB control signal.

Clause 30. The fully-differential amplifier of clause 29, wherein the CMFB control circuit includes: a pair of current mirrors; and a second pair of input transistors to input respective ones of the common-mode setpoint and the midpoint of the differential pair of output signals, the second pair of input transistors to conduct currents that flow through the pair of current mirrors of the CMFB control circuit that conduct currents through the pair of diode connected devices.

Clause 31. The fully-differential amplifier of clause 30, wherein the CMFB control circuit includes current sources to provide tail currents to respective ones of the pair of input transistors and the second pair of input transistors.

Clause 32. A fully-differential amplifier comprising: one or more stages to amplify a differential pair of input signals to produce an amplified differential pair of signals, the one or more stages including an amplification stage with a common-mode feedback (CMFB) input for a CMFB control signal; and a CMFB control circuit to measure a midpoint of the differential pair of output signals and produce the CMFB control signal to drive the midpoint of the differential pair of output signals to a common-mode setpoint, the CMFB control circuit including a CMFB amplifier circuit that includes: a pair of diode connected devices; and a pair of input transistors to input respective ones of the common-mode setpoint and the midpoint of the differential pair of output signals, the pair of input transistors to conduct a current that flows through the pair of diode connected devices that produce the CMFB control signal.

Clause 33. The fully-differential amplifier of clause 32, wherein the CMFB control circuit includes a resistive divider circuit to produce a signal at the midpoint of the differential pair of output signals.

Clause 34. The fully-differential amplifier of clause 32 or clause 33, wherein the CMFB control circuit includes: a pair of current mirrors; and a second pair of input transistors to input respective ones of the common-mode setpoint and the midpoint of the differential pair of output signals, the second pair of input transistors to conduct currents that flow through the pair of current mirrors of the CMFB control circuit that conduct currents through the pair of diode connected devices.

Clause 35. The fully-differential amplifier of clause 34, wherein the CMFB control circuit includes current sources to provide tail currents to respective ones of the pair of input transistors and the second pair of input transistors.

Clause 36. The fully-differential amplifier of any of clauses 32 to 35, wherein the amplification stage is a folded-cascode (FC) amplification stage.

Clause 37. The fully-differential amplifier of clause 36, wherein the FC amplification stage includes for respective ones of the differential pair of input signals: a first pair of current sources; a second pair of current sources; and an input pair of transistors, the first pair of current sources to provide tail currents for the input pair of transistors, the input pair of transistors to conduct currents to respective summing nodes of the second pair of current sources that provide currents to the FC amplification stage.

Clause 38. The fully-differential amplifier of clause 37, wherein the fully-differential amplifier comprises a class-AB output stage to further amplify the amplified differential pair of signals to produce a differential pair of output signals, and the class-AB output stage includes a folded mesh of transistors to bias a pair of output transistors in class-AB, and wherein the second pair of current sources are implemented with transistors including the transistors of the folded mesh of transistors.

Clause 39. The fully-differential amplifier of clause 37 or clause 38, wherein one of the current sources of either the first pair of current sources or the second pair of current sources includes a common-mode feedback (CMFB) input for the CMFB control signal.

Many modifications and other implementations of the disclosure set forth herein will come to mind to one skilled in the art to which the disclosure pertains having the benefit of the teachings presented in the foregoing description and the associated figures. Therefore, it is to be understood that the disclosure is not to be limited to the specific implementations disclosed and that modifications and other implementations are intended to be included within the scope of the appended claims. Moreover, although the foregoing description and the associated figures describe example implementations in the context of certain example combinations of elements and/or functions, it should be appreciated that different combinations of elements and/or functions may be provided by alternative implementations without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. A fully-differential amplifier comprising:
one or more stages to amplify a differential pair of input signals to produce an amplified differential pair of signals; and
a class-AB output stage to further amplify the amplified differential pair of signals to produce a differential pair of output signals, the class-AB output stage including a pair of differential outputs, the class-AB output stage including for respective ones of the pair of differential outputs:
a pair of output transistors coupled to a respective one of the pair of differential outputs, and to respective ones of a first supply rail and a second supply rail;
a folded mesh of transistors to bias the pair of output transistors in class-AB, and in which transistors of the folded mesh of transistors form a control amplifier to regulate control inputs of the pair of output transistors; and
a feedback circuit to drive the control amplifier.

2. The fully-differential amplifier of claim 1, wherein the fully-differential amplifier comprises, for respective ones of the pair of differential outputs:
a compensation network to provide frequency compensation for the fully-differential amplifier.

3. The fully-differential amplifier of claim 1, wherein the pair of output transistors includes a first output transistor and a second output transistor, and the feedback circuit includes:
a minimum selector circuit including a current mirror and a first sense transistor;
a second sense transistor to sense current through the second output transistor, the second sense transistor to conduct a current that flows through the current mirror of the minimum selector circuit to the first sense transistor, the first sense transistor to sense the current through the first output transistor; and
a rectifier coupled to the first sense transistor, the first sense transistor to conduct a current that flows through the rectifier and steers the control amplifier.

4. The fully-differential amplifier of claim 3, wherein the rectifier is implemented with a diode-connected transistor.

5. The fully-differential amplifier of claim 3, wherein the rectifier is implemented with a cascode diode-connected transistor.

6. The fully-differential amplifier of claim 3, wherein the feedback circuit includes a resistor coupled between the second sense transistor and the current mirror to prevent the current mirror from conducting excessive current in the event the second output transistor is in or near full conduction.

7. The fully-differential amplifier of claim 3, wherein the feedback circuit includes one or more source degeneration resistors to control a transconductance of the feedback circuit.

8. The fully-differential amplifier of claim 7, wherein the source degeneration resistors include first and second source degeneration resistors coupled between the current mirror and the first supply rail, and a third source degeneration resistor coupled between the second sense transistor and the second supply rail.

9. The fully-differential amplifier of claim 1, wherein the one or more stages include a fully-balanced differential difference amplifier (FBDDA) stage.

10. The fully-differential amplifier of claim 9, wherein the fully-differential amplifier is connected as a current-feedback amplifier, and the FBDDA stage includes multiple pairs of inputs, including a first pair of inputs to receive one of the differential pair of input signals and an opposite one of a differential pair of input feedback signals, and a second pair of inputs to receive the other one of the differential pair of input signals and the other, opposite one, of the differential pair of input feedback signals.

11. The fully-differential amplifier of claim 10, wherein the FBDDA stage includes a first pair of current sources to provide tail currents for the first pair of inputs, and a second pair of current sources to provide tail currents for the second pair of inputs.

12. The fully-differential amplifier of claim 10, wherein for respective ones of the pair of differential outputs, the FBDDA stage includes:
output nodes; and
load resistors coupled to the output nodes and respective ones of the first supply rail and the second supply rail.

13. The fully-differential amplifier of claim 9, wherein the FBDDA stage includes a set of transconductance control circuits to act as an electronic implementation of a Zener diode or as current switches for the first pair of inputs or the second pair of inputs.

14. The fully-differential amplifier of claim 1, wherein the one or more stages include a folded-cascode (FC) amplification stage.

15. The fully-differential amplifier of claim 14, wherein the FC amplification stage includes for respective ones of the differential pair of input signals:
a first pair of current sources;
a second pair of current sources; and
an input pair of transistors,
the first pair of current sources to provide tail currents for the input pair of transistors, the input pair of transistors to conduct currents to respective summing nodes of the second pair of current sources that provide currents to the FC amplification stage.

16. The fully-differential amplifier of claim 15, wherein the second pair of current sources are implemented with transistors including the transistors of the folded mesh of transistors.

17. The fully-differential amplifier of claim 15, wherein one of the current sources of either the first pair of current sources or the second pair of current sources includes a common-mode feedback (CMFB) input for a CMFB control signal.

18. The fully-differential amplifier of claim 15, wherein the FC amplification stage includes a set of transconductance control circuits to act as an electronic implementation of a Zener diode or as current switches for the input pair of transistors.

19. The fully-differential amplifier of claim 1, wherein one of the one or more stages includes an amplification stage with a common-mode feedback input for a common-mode feedback (CMFB) control signal, and the fully-differential amplifier comprises:
a CMFB control circuit to measure a midpoint of the differential pair of output signals and produce the CMFB control signal to drive the midpoint of the differential pair of output signals to a common-mode setpoint.

20. The fully-differential amplifier of claim 19, wherein the CMFB control circuit includes a resistive divider circuit to produce a signal at the midpoint of the differential pair of output signals.

21. The fully-differential amplifier of claim 19, wherein the CMFB control circuit includes a CMFB amplifier circuit including:

a pair of diode connected devices; and a pair of input transistors to input respective ones of the common-mode setpoint and the midpoint of the differential pair of output signals, the pair of input transistors to conduct a current that flows through the pair of diode connected devices that produce the CMFB control signal.

22. The fully-differential amplifier of claim 21, wherein the CMFB control circuit includes:

a pair of current mirrors; and a second pair of input transistors to input respective ones of the common-mode setpoint and the midpoint of the differential pair of output signals, the second pair of input transistors to conduct currents that flow through the pair of current mirrors of the CMFB control circuit that conduct currents through the pair of diode connected devices.

23. The fully-differential amplifier of claim 22, wherein the CMFB control circuit includes current sources to provide tail currents to respective ones of the pair of input transistors and the second pair of input transistors.

\* \* \* \* \*